(12) United States Patent
Chu (10) Patent No.: US 8,698,609 B2
(45) Date of Patent: Apr. 15, 2014

(54) SWITCH-ON/OFF VIBRATING ALERT DEVICE

(76) Inventor: Ching-Hsiung Chu, New Taipei (TW)

( * ) Notice: Subject to any disclaimer, the term of this patent is extended or adjusted under 35 U.S.C. 154(b) by 166 days.

(21) Appl. No.: 13/332,367

(22) Filed: Dec. 21, 2011

(65) Prior Publication Data

US 2013/0162417 A1 Jun. 27, 2013

(51) Int. Cl.
*G08B 6/00* (2006.01)
*G06F 3/041* (2006.01)
*G09G 5/00* (2006.01)
*H01H 3/08* (2006.01)

(52) U.S. Cl.
USPC ......... 340/407.2; 345/173; 345/168; 200/336

(58) Field of Classification Search
USPC ......... 340/407.2; 345/173; 200/336; 345/168
See application file for complete search history.

(56) References Cited

U.S. PATENT DOCUMENTS

| | | | |
|---|---|---|---|
| 3,950,627 A * | 4/1976 | Murata et al. | 200/530 |
| 6,140,596 A * | 10/2000 | Tsay | 200/406 |
| 2011/0095708 A1* | 4/2011 | Sharrah et al. | 315/362 |
| 2011/0241442 A1* | 10/2011 | Mittleman et al. | 307/112 |
| 2012/0247934 A1* | 10/2012 | Schmidt et al. | 200/336 |
| 2013/0001058 A1* | 1/2013 | Bowler et al. | 200/600 |
| 2013/0015985 A1* | 1/2013 | Peterson et al. | 341/27 |
| 2013/0032457 A1* | 2/2013 | Quinn | 200/341 |
| 2013/0106765 A1* | 5/2013 | Beecher et al. | 345/174 |
| 2013/0141342 A1* | 6/2013 | Bokma et al. | 345/173 |

\* cited by examiner

*Primary Examiner* — George Bugg
*Assistant Examiner* — Jack K Wang (57) ABSTRACT

A switch-on/off vibrating alert device, particularly the device capable of producing a vibrating alert when a switch turns on or off a power supply, and the device comprises: a touch device installed onto a switch casing and provided for a human hand to touch in order to turn on/off the switch, and the casing includes a vibrator for generating a vibration when a control for an operation of turning on/off the switch is received from the touch device, and driving the casing and the touch device to vibrate synchronously, and users can know whether or not the switch has turned on or off the power through the vibration, and thus improving the convenience of the use.

7 Claims, 7 Drawing Sheets

SWITCH-ON/OFF VIBRATING ALERT DEVICE

BACKGROUND OF THE INVENTION

1. Field of the Invention

The present invention relates to a switch-on/off vibrating alert device, in particular to a device capable of generating a vibrating alert by switching on or powering off an electronic or electric product, and also relates to a casing, a touch device and a vibrator of the device.

2. Description of the Prior Art

Power switch comes with a variety of specifications and dimensions and a broad scope of applicability, and power switches are generally divided into touch switches, press-button switches, toggle switches and knob switches according to the way of their operation, and the power switches can be used for powering on/off or switching a circuit to trigger the power switch to output an electronic signal.

In addition, a general precision device, a mini device, or a mini electric appliance usually uses the power switch which is generally called a sensitive switch or a micro switch operated by means of a touch, a press button, a switching, or a knob. Since the power switches of these types are short, small, and light, therefore such power switches can be applied in an electronic equipment or instrument with a limited space and having a mini or micro switch. For example, the power switches are used in the 3C electronic products or micro computers.

However, after a user touches, presses, flips or turns the aforementioned conventional power switch, the user does not know whether the power is connected or disconnected until the user observes that there is a change of the operating status of an electric appliance controlled by the power switch. In particular, the way of operating a touch power switch makes it very difficult for users to observe the power-on or power-off status immediately, so that the users may turn the power on or off for several times before they can operate an electric appliance, and the situation becomes even worse for blind people.

SUMMARY OF THE INVENTION

Therefore, it is a primary objective of the present invention to provide a device capable of generating a vibrating alert by switching on or powering off an electronic or electric product to overcome the aforementioned problems of the prior art, since after a user touches, presses, flips or turns the aforementioned conventional power switch, the user does not know whether the power is connected or disconnected until the user observes that there is a change of the operating status of an electric appliance controlled by the power switch. Obviously, the use of traditional power switches is inconvenient and requires improvements.

To achieve the foregoing objective, the present invention provides a switch-on/off vibrating alert device, comprising:
a switch casing;
a touch device, installed onto the casing, and provided for a human hand to touch in order to turn on/off the switch; and
a vibrator, installed in the casing, for producing a vibration when receiving a control for an operation of turning on/off the switch from the touch device, and driving the casing and the touch device to vibrate synchronously.

When a user operates the touch device to drive the switch, the user can immediately determine whether or not the switch has turned on the power through the vibration of the casing and the touch device, so as to achieve the vibrating alert when the switch turns on or off the power, and improve the convenience of using the power switch.

Other embodiments of the present invention are described below:

In actual applications, the switch can be a touch switch, a press-button switch, a toggle switch or a knob switch.

In a specific embodiment, the present invention further comprises:
a containing slot, formed inside the casing, and the touch device being formed flatly at the top of the casing, and the vibrator being installed in the containing slot;
a metal sensing plate, installed in the containing slot and at a position proximate to the touch device to an extent sufficient to sense the touch of a human hand, and the touch device outputting a sensing signal after sensing the touch of the human hand;
a control unit, installed in the containing slot; and
a conductive element, electrically coupled between the sensing plate and the control unit, for transmitting the sensing signal to the control unit, such that the control unit outputs a trigger signal for turning on/off and controlling an external electric appliance, and the vibrator receives the trigger signal to produce a vibration. Wherein, the conductive element is substantially in a spiral shape.

The touch device at the top of the casing can be touched, so that the sensing plate generates a sensing signal, and the control unit receives the sensing signal through the conductive element to output a trigger signal to an external electric appliance in order to turn on/off or control the electric appliance, wherein the electric appliance can be an indoor or outdoor electric appliance, particularly a lamp used in a bath room, or an electronic controller for turning on/off a water tap or flushing a toilet.

Therefore, the present invention can further resist external liquids from entering into the containing slot by the waterproof design of the casing, so as to prevent the sensing plate, the control unit, the conductive element and the vibrator in the containing slot from being rusted, and enhance the service life of the switch significantly.

In another embodiment, the present invention further comprises:
the touch device being in a translucent type, and the sensing plate having a hollow pattern disposed thereon;
a first light emitting diode, installed at the top of the control unit; and
a reflective cup, partitioned between the sensing plate and the control unit, and having a downwardly tapered reflective conical groove, and the reflective cup being installed in the containing slot at an outer periphery of the first light emitting diode, such that the first light emitting diode is disposed in the conical groove, and the first light emitting diode receives the trigger signal to emit light, and the light emitted by the first light emitting diode is reflected and condensed by the conical groove to pass through the hollow pattern and the touch device and projected towards the top of the casing.

Wherein, the invention further comprises a translucent plate installed in the containing slot formed between the touch device and the sensing plate, and the touch device is in a transparent and translucent type, and the translucent plate is in a semi-transparent and translucent type. The translucent plate is a semi-transparent translucent type, and the translucent plate has a notch formed at the bottom of the translucent plate for containing sensing plate, and the translucent plate has a translucent pattern formed thereon and corresponding to the hollow pattern.

In a further embodiment, the present invention further comprises:

the casing having an outer peripheral wall substantially in a translucent type;
a plurality of second light emitting diodes, installed at the periphery of the control unit; and
a reflective cup, partitioned between the sensing plate and the control unit, and having a reflective conical surface formed at an outer wall of the reflective cup, and the reflective cup being installed in the containing slot between the second light emitting diodes, and the second light emitting diodes being disposed at the outer periphery of the conical surface, and the second light emitting diode receiving the trigger signal to emit light, and the light emitted by the second light emitting diode being reflected by the conical surface, passed through the outer peripheral wall, and projected towards the surrounding of the casing.

The casing includes a plurality of protruding rings disposed on an outer peripheral wall of the casing to provide an interference effect, and the periphery of the touch device is extended to the outside of the outer peripheral wall to form a circular flange.

The casing includes a slot opening formed at the bottom of the casing and interconnected to the containing slot, a bottom cover installed in the slot opening, and a positioning slot formed at the top of the bottom cover for containing the vibrator.

DETAILED DESCRIPTION OF THE PREFERRED EMBODIMENTS

Figure 1:
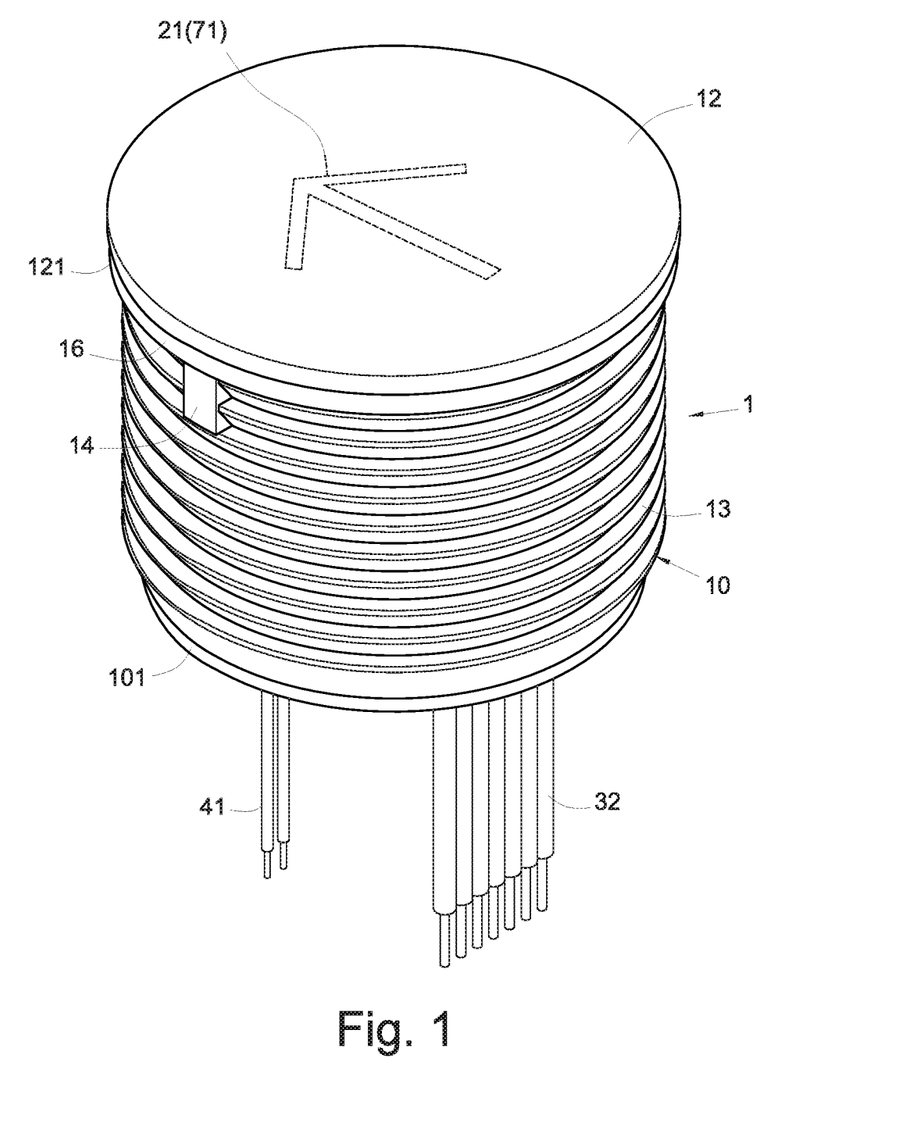
FIG. 1 is a perspective view of a preferred embodiment of the present invention.

With reference to FIG. 1 for a perspective view of a preferred embodiment of the present invention together with FIGS. 2 to 7 for a switch-on/off vibrating alert device of the present invention, the switch-on/off vibrating alert device comprises a switch casing 10, a touch device 12 and a vibrator 4.

Figure 2:
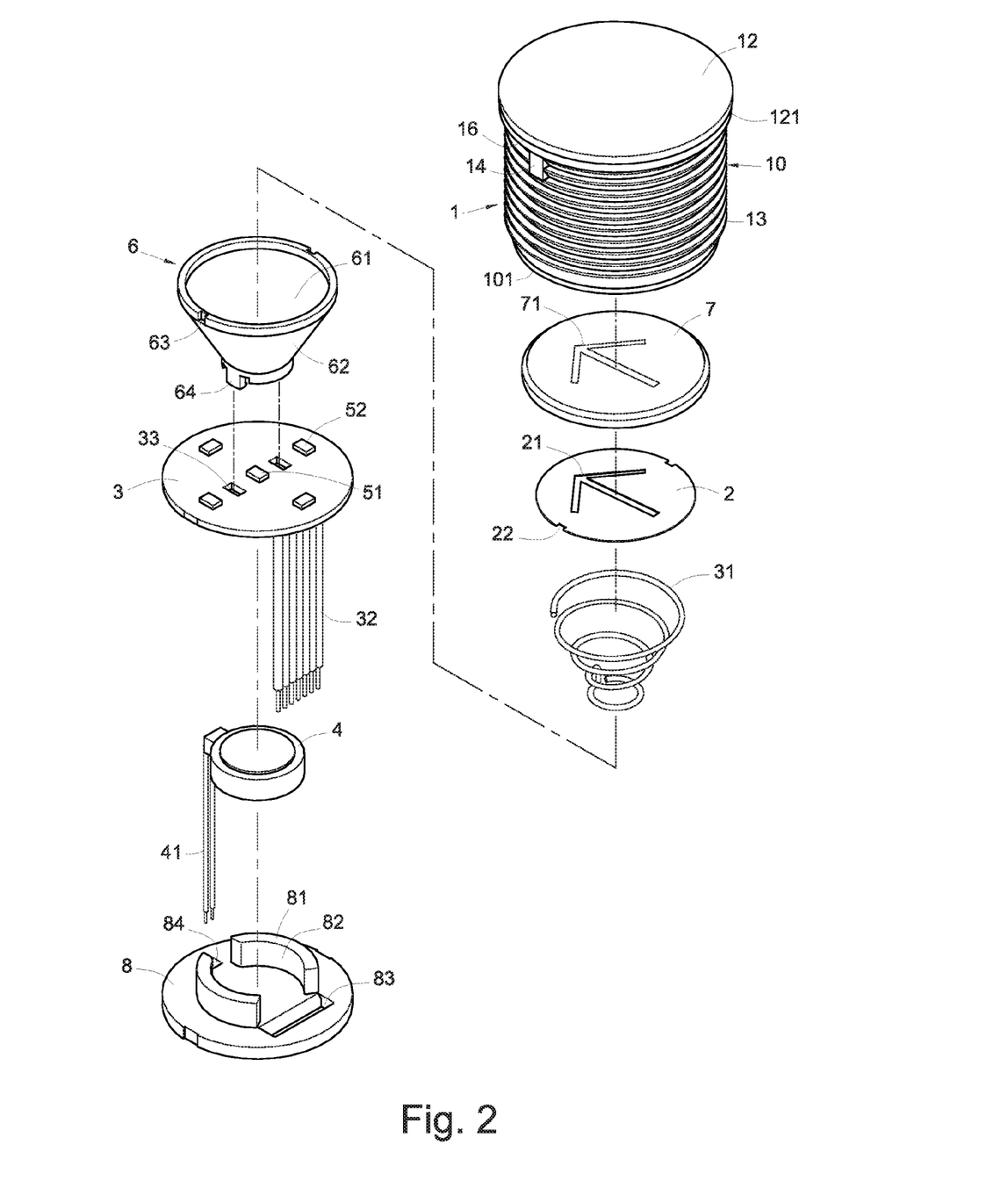
FIG. 2 is an exploded view of FIG. 1.
Figure 3:
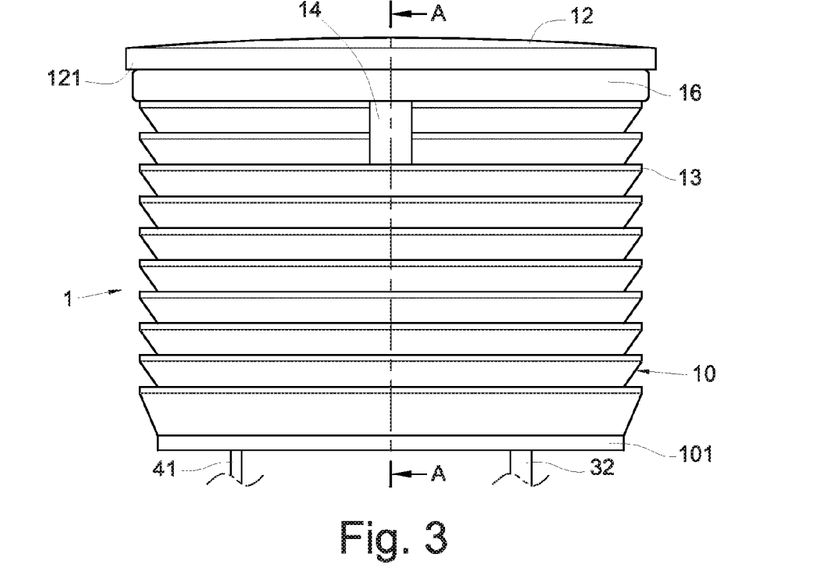
FIG. 3 is a front view of FIG. 1.

The touch device 12 is installed onto the casing 10 and provided for a human hand to touch in order to turn on/off the switch.

Figure 9:
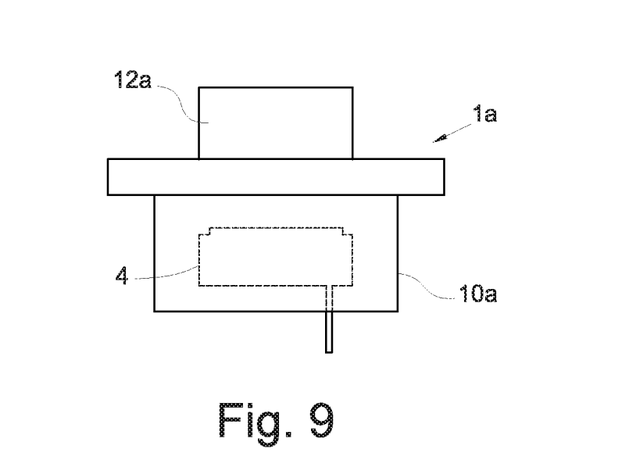
FIG. 9 is a front view of a first additional implementation of the preferred embodiment of FIG. 1.
Figure 10:
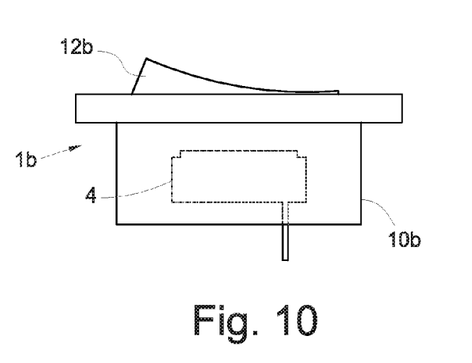
FIG. 10 is a front view of a second additional implementation of the preferred embodiment of FIG. 1.
Figure 11:
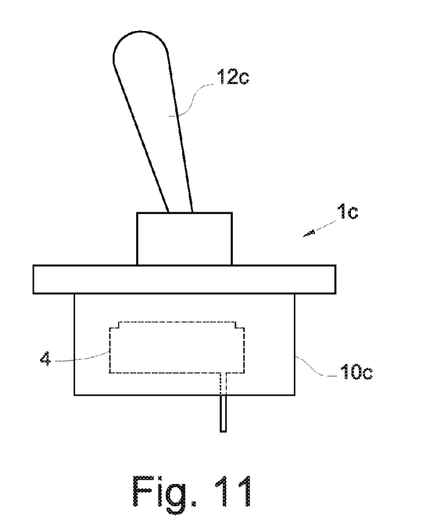
FIG. 11 is a front view of a third additional implementation of the preferred embodiment of FIG. 1.
Figure 12:
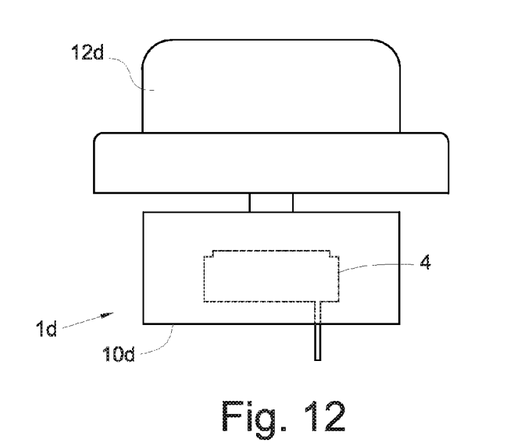
FIG. 12 is a front view of a fourth additional implementation of the preferred embodiment of FIG. 1.

In an embodiment, the switch can be a touch switch 1, a press-button switch 1a, a toggle switch 1b, 1c or a knob switch 1d, and the touch device 12 can be integrally formed at the top of the casing 10 of the touch switch 1, or the touch device 12a can be a press button at the top of the casing 10a of the press-button switch 1a (as shown in FIG. 9, or the touch device 12b, 12c can be a switching key or a switching rod at the top of the casing 10b, 10c of the toggle switch 1b, 1c (as shown in FIGS. 10 and 11), or the touch device 12d can be a knob at the top of the casing 10d of the knob switch 1d (as shown in FIG. 12).

The vibrator 4 is installed in the casing 10, 10a, 10b, 10c, 10d for producing a vibration after receiving a control of an operation of turning on/off the switch 1, 1a, 1b, 1c, 1d by the touch device 12, 12a, 12b, 12c, 12d, and driving the casing 10, 10a, 10b, 10c, 10d and the touch device 12, 12a, 12b, 12c, 12d to vibrate synchronously. The vibrator 4 is substantially a vibrating motor.

The operation for the touch device 12, 12a, 12b, 12c, 12d to turn on/off the switch 1, 1a, 1b, 1c, 1d includes: touching the top of the casing 10 of the touch switch 1, pressing a press button of the press-button switch 1a, flipping a switching key or a switching rod of the toggle switch 1b, 1c, or turning a knob of the knob switch 1d.

The operation for the touch device 12, 12a, 12b, 12c, 12d to turn on/off the switch 1, 1a, 1b, 1c, 1d can turn on/off the power by an electronic control or a physical contact of the touch device 12, 12a, 12b, 12c, 12d, and can turn on the vibrator 4 to produce a vibration.

At the moment when a user operates the touch device 12, 12a, 12b, 12c, 12d to drive the switch 1, 1a, 1b, 1c, 1d to turn on/off the power, the user can determine whether the switch 1, 1a, 1b, 1c, 1d has turned on or off the power by the vibration of the casing 10, 10a, 10b, 10c, 10d and the touch device 12, 12a, 12b, 12c, 12d.

Therefore, the present invention can inform the user whether the switch has turned on or off the power by the vibrating alert to overcome the problems of the prior art, since after a user touches, presses, flips or turns the aforementioned conventional power switch, the user does not know whether the power is connected or disconnected until the user observes that there is a change of the operating status of an electric appliance controlled by the power switch, and the users have to operate power switch for many times before they can tell that the power is turned on, and thus causing inconvenience to the use. The present invention can improve the convenience of using the power switch.

In a further preferred embodiment of the present invention, a touch switch 1 is used as an example, and the touch switch 1 further comprises a containing slot 11, a circular metal sensing plate 2, a control unit 3, a metal conductive element 31, a first light emitting diode 51, a plurality of second light emitting diodes 52 and a reflective cup 6.

The casing 10 is substantially in a cylindrical shape, made of plastic and integrally formed by an injection molding method, and the containing slot 11 is formed in the casing 10, and the touch device 12 is formed flatly at the top of the casing 10, and the casing 10 has a slot opening 111 formed at the bottom of the casing 10 and interconnected to the containing slot 11, and the vibrator 4 is installed in containing slot 11 and at a position proximate to the slot opening 111.

The casing 10 has a plurality of parallel protruding rings 13 formed on an outer peripheral wall 101 of the casing 10 and sufficiently for producing an interference effect, so that the outer peripheral wall 101 of the casing 10 becomes a cascading shape, and the outer peripheral wall 101 of the casing 10 and the protruding rings 13 of this preferred embodiment are transparent and translucent type, and the periphery of the touch device 12 is extended to an outer side of the outer peripheral wall 101 of the casing 10 to form a circular flange 121, and the flange 121 can shelter the protruding ring 13 on the outer peripheral wall 101, and the touch device 12 and the flange 121 of this preferred embodiment are of a semi-transparent translucent type.

The casing 10 has a protruding member 14 formed on the outer peripheral wall 101 of the casing 10 for indicating at least one direction, and there are two protruding members 14 used in this preferred embodiment and disposed adjacent to the outer peripheral wall 101 of the flange 121, and the protruding members 14 are symmetrical to each other, and the casing 10 also can have a circular groove 15 formed on the outer peripheral wall 101 and disposed at a position proximate to the touch device 12 and the flange 121 and parallel to the flange 121, and the circular groove 15 is sheathed with a sealing ring 16 made of silicone.

The sensing plate 2 is installed in the containing slot 11 and disposed proximate to the bottom of the touch device 12, and sufficient to sense the touch position of a human hand, so that when sensing the touch of a human hand, the touch device 12 outputs a sensing signal. When the human hand touches the touch device 12, a capacitance effect is produced between the human hand and the sensing plate 2, so that the potential difference produced by the capacitance effect forms the sensing signal. The sensing plate 2 has a hollow pattern 21 formed thereon, and the hollow pattern 21 has a pattern type of a pattern, a figure, a text, a number or a symbol.

The control unit 3 is installed at a middle position in the containing slot 11 and between the sensing plate 2 and the vibrator 4, and disposed at a position proximate to the top of the vibrator 4. The control unit 3 of this embodiment is a circular circuit board, and the circuit board includes an integrated circuit or a chip installed thereon, and the circuit board is electrically coupled to a plurality of power and signal conductive wires 32, and the conductive wires 32 are extended from a slot opening 111 of the containing slot 11 formed at the bottom of the casing to the outside and electrically coupled to an external power supply and another electric appliance (not shown in the figure).

The other electric appliance can be a general indoor or outdoor electric appliance, particularly a lamp used in a bathroom or an electronic controller for turning on/off a water tap or flushing a toilet.

The conductive element 31 is electrically coupled between the bottom of the sensing plate 2 and the control unit 3 for transmitting a sensing signal of the sensing plate 2 to the control unit 3, so that the control unit 3 outputs a trigger signal for turning on/off and controlling another external electric appliance, and the vibrator 4 can receive the trigger signal to produce a vibration.

The first light emitting diode 51 is installed at the center of the top of the control unit 3, so that the first light emitting diode 51 can be situated at the center of the middle section of the containing slot 11, and the first light emitting diode 51 of this preferred embodiment can be a full-color RGB light emitting diode.

The second light emitting diodes 52 are installed at the periphery of the top of the control unit 3 and equidistantly arranged in the surrounding of the first light emitting diode 51, and the second light emitting diodes 52 of this preferred embodiment are of a monochrome type.

The reflective cup 6 is disposed in the containing slot 11, partitioned between the sensing plate 2 and the control unit 3, and situated between the external periphery of the first light emitting diode 51 and the second light emitting diode 52, and the reflective cup 6 includes a downwardly tapered reflective conical groove 61, and the reflective cup 6 has a downwardly tapered reflective conical surface 62 formed on an outer wall of the reflective cup 6, so that the first light emitting diode 51 is situated in the conical groove 61, and the second light emitting diode 52 is situated at the external periphery of the conical surface 62.

The first and second light emitting diodes 51, 52 can emit light after receiving the trigger signal, and the light emitted from the first light emitting diode 51 can be reflected and condensed by the conical groove 61, passed through the hollow pattern 21 and the touch device 12, and projected to the top of the casing 10. The light emitted from the second light emitting diode 52 can be reflected from the conical surface 62, passed through the outer peripheral wall 101, and projected towards the surrounding of the casing 10. Since the reflective cup 6 is partitioned between the first and second light emitting diodes 51, 52, the lights emitted from the first and second light emitting diodes 51, 52 can be prevented from interfering with each other.

Figure 8:
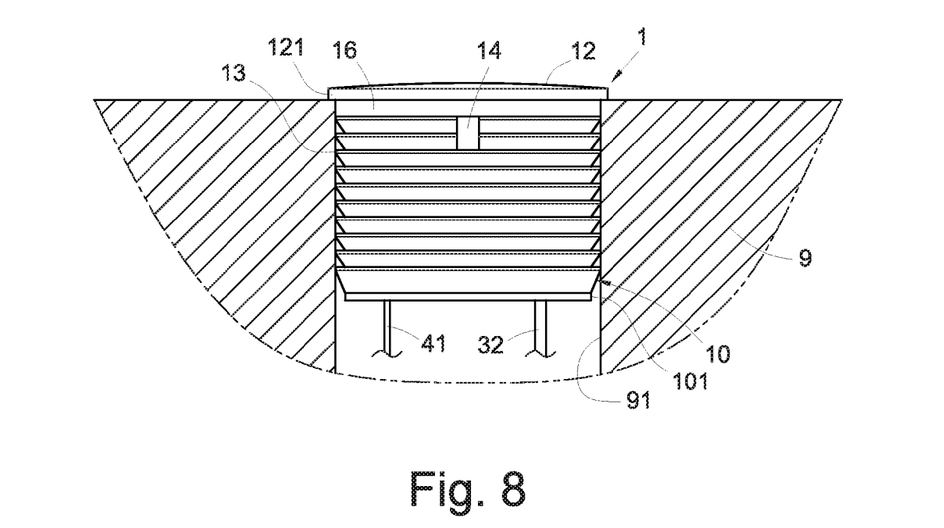
FIG. 8 is a schematic view of a using status of FIG. 3.

With the aforementioned structure, the casing 10 of the present invention can be inserted and installed in a containing hole 91 at a predetermined position 9 on a surface (as shown in FIG. 8), so that the casing 10 can cover the containing hole 91, and the touch device 12 is exposed from a surface at a predetermined position 9 outside the containing hole 91, wherein the predetermined position 9 can be an indoor or outdoor wall to facilitate the touch by a human hand, which also can be a surface of a home electric appliance or a sanitary equipment, and the containing hole 91 can be connected to an external power supply and another electric appliance, and the conductive wire 32 at the bottom of the casing 10 is passed through the containing hole 91 and electrically coupled to the external power supply and the other electric appliance.

Therefore, the protruding ring 13 on the outer peripheral wall 101 of the casing 10 can produce an interference effect with the inner wall of the containing hole 91, so that the outer peripheral wall 101 of the casing 1 is attached closely with the inner wall of the containing hole 91 through the protruding ring 13 to prevent the casing 10 from being loosened or falling out, and also prevent moisture or other liquid from entering into the containing hole 91. In the meantime, the flange 121 can cover the containing hole 91, and the top end of the outer peripheral wall 101 of the casing 10 can be attached closely with the inner wall of the containing hole 91 through the sealing ring 16 to further prevent moisture or other liquid from entering into the containing hole 91.

In a general using situation, when a user has not touched the touch device 12, the first light emitting diode 51 can emit a color light (such as a green light), and the green light is reflected from the conical groove 61 and condensed to provide a more uniform light beam, and the green light is passed through the hollow pattern 21 and the semi-transparent touch device 12 and projected to the top of the casing 10. In the meantime, the green light with the contour of the hollow pattern 21 is projected onto a surface of the touch device 12.

At the moment when a user touches a predetermined position 9 on a surface of the touch device 12 by a finger, the sensing plate 2 will generate a sensing signal, and the control unit 3 receives the sensing signal through the conductive element 31 to output a trigger signal to another external electric appliance through the conductive wire 32 to turn on/off and control the electric appliance.

Meanwhile, the trigger signal drives the vibrator 4 to produce a vibration, and the vibrator 4 drives the casing 10 and the touch device 12 to vibrate synchronously, so that users can observe the operation of turning on/off or controlling the electric appliance by the touch switch 1. The first light emitting diode 51 can emit another color light (such as a red light, and the red light is projected towards the top of the casing 10. In the meantime, the red light with the contour of the hollow pattern 21 is projected on a surface of the touch device 12. Therefore, the green light and the red light can be used to provide the effects of illumination and indication and show the using status of the lamp, home electric appliance or sanitary equipment having the touch switch 1.

In the same time, the second light emitting diode 52 can emit another color light (such as a blue light), and the blue light is reflected from the conical surface 62, passed through the transparent outer peripheral wall 101, and projected to the surrounding of the casing 10 to produce a radiance in a circular shape. The second light emitting diode 52 can change to another color light (such a yellow light) when a user touches the touch device 12, and the yellow light can be passed through the outer peripheral wall 101 and projected towards the surrounding of the casing 10. Therefore, the blue light can be used as a background light or provides the effects of illumination and indication, and also can be used to show the using situation of the lamp, home electric appliance or sanitary equipment having the touch switch 1.

In addition, the color of the light produced by the first and second light emitting diodes 51, 52 can be changed freely, or the timing of emitting the light by the first and second light emitting diodes 51, 52 can be controlled to produce interactive effects between the first and second light emitting diodes 51, 52, so as to enhance the overall aesthetic feeling.

It is noteworthy to point out that when water or any other liquid is spilled at the predetermined position 9 on the surface, water or other liquids cannot enter into the containing slot 11, since there is no seam or gap between the touch device 12 and the peripheral wall 101 of the casing 10. Therefore, the invention can prevent moisture or other liquids from affecting or damaging the sensing plate 2, the control unit 3, the conductive element 31 and the vibrator 4 in the casing 10, and enhance the service life of the switch significantly.

Therefore, the present invention can use the first and second light emitting diodes 51, 52 to produce the light for illuminations and indications to show the using status of a lamp, home electric appliance or sanitary equipment having the touch switch 1, and enhance the overall aesthetic feeling. In the meantime, the waterproof design of the casing 10 can stop external moisture or liquid from entering into the containing slot 11 and prevent the sensing plate 2, the control unit 3, the conductive element 31 and the vibrator 4 in the containing slot 11 from being rusted, so as to enhance the service life of the switch significantly.

In another preferred embodiment, the conductive element 31 is in a spiral shape, and both ends of the conductive element 31 are rotated along the inner wall of the conical groove 61 and extended to the sensing plate 2 and the control unit 3 to dodge the light emitted from the first light emitting diode 51, so as to avoid the conductive element 31 affecting or blocking the light. Since the conductive element 31 is in a spiral shape, and serves as a spring, therefore the conductive element 31 is abutted elastically against a position between the bottom of the sensing plate 2 and the top of the control unit 3.

In another preferred embodiment, the present invention further comprises a circular translucent plate 7 installed in the containing slot 11 between the touch device 12 and the sensing plate 2, and the touch device 12 of this preferred embodiment is of a transparent and translucent type, and the translucent plate 7 is of a semi-transparent translucent type for covering the sensing plate 2, the conductive element 31, the control unit 3 and the vibrator 4 in the containing slot 11, and the translucent plate 7 has a translucent pattern 71 corresponding to the hollow pattern 21, and the translucent pattern 71 has a pattern type of a pattern, a figure, a text, a number or a symbol, and the translucent pattern 71 can be formed by a paint coating or laser carving method.

Figure 4:
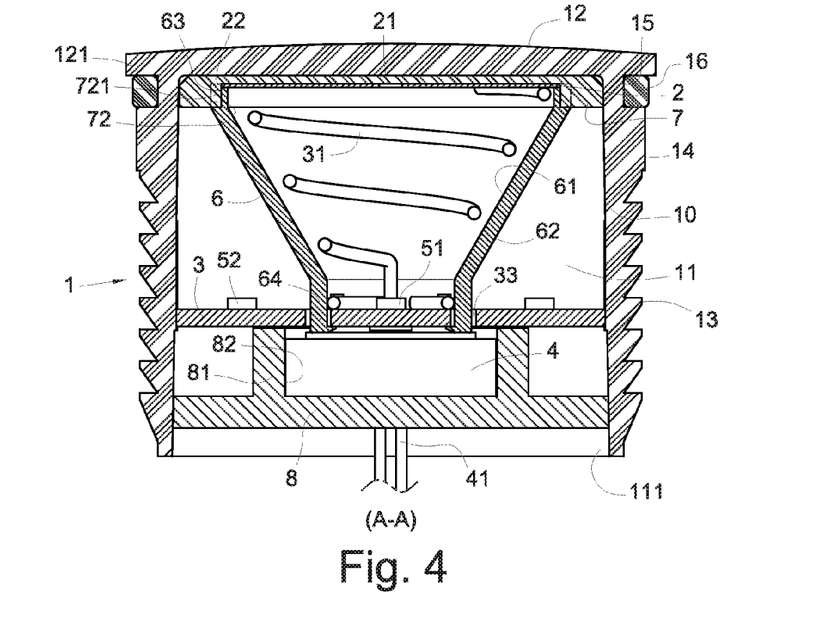
FIG. 4 is a cross-sectional view of Section A-A of FIG. 3.
Figure 5:
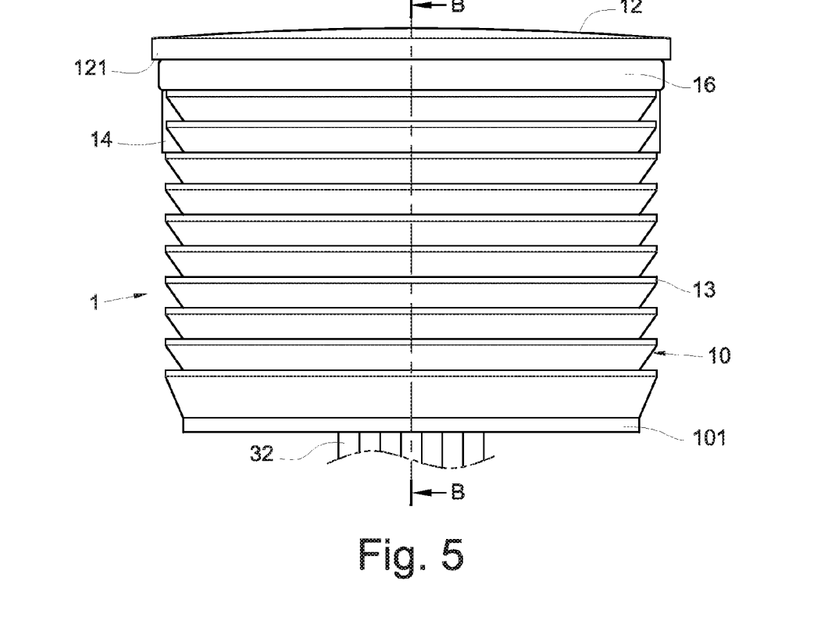
FIG. 5 is a right side view of FIG. 3.
Figure 6:
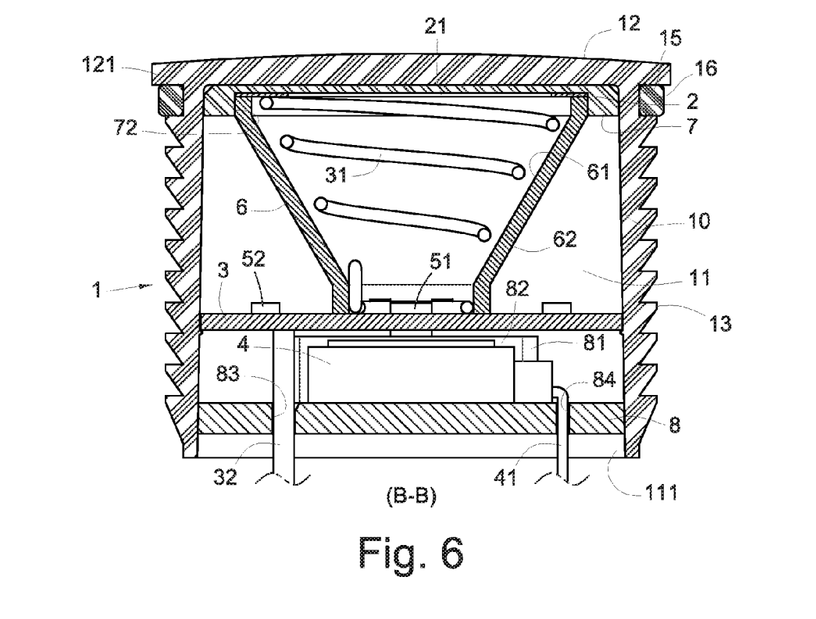
FIG. 6 is a cross-sectional view of Section B-B of FIG. 5.
Figure 7:
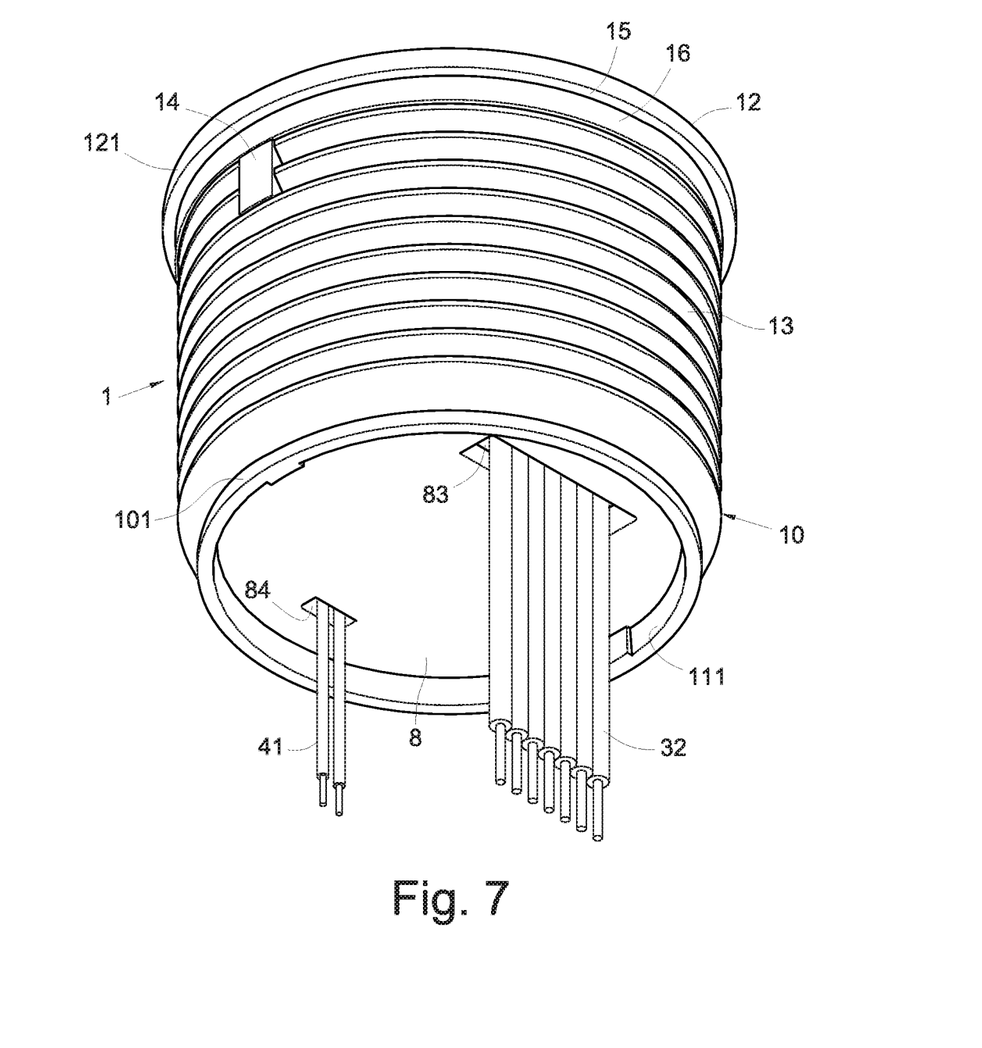
FIG. 7 is a perspective bottom view of FIG. 1.

The translucent plate 7 includes a notch 72 formed at the bottom of the translucent plate 7 for containing the sensing plate 2, and at least one protrusion 721 formed on an inner wall of the notch 72 (as shown in FIG. 4), and at least one recession 22 formed at the periphery of the sensing plate 2, wherein the protrusion 721 is embedded into the recession 22 for fixing the sensing plate 2 into the notch 72 of the translucent plate 7, and the protrusions 721 are symmetrically to each other and the recessions 22 are symmetrical to each other.

The light emitted from the first light emitting diode 51 can be reflected from the conical groove 61 and condensed, passed through the hollow pattern 21, the translucent pattern 71 and the transparent touch device 12, and projected towards the top of the casing 10. In the meantime, a light with the contour of the hollow pattern 21 and the translucent pattern 71 is formed on the touch device 12.

In addition, the reflective cup 6 has a distal slot 63 formed at the periphery of the top of the reflective cup 6 for embedding at least one protrusion 721, and the reflective cup 6 has at least one hook portion 64 formed at the periphery of the bottom of the reflective cup 6, and the control unit 3 has at least one positioning hole 33 formed at a position proximate to the center of the control unit 3 for receiving the hook portion 64, so that the reflective cup 6 is positioned and fixed between the bottom of the translucent plate 7 and the top of the control unit 3, and the sensing plate 2 is positioned at the top of the conical groove 61, and the distal grooves 63 are symmetrical to each other.

A pattern can be formed on the surface of the touch device 12 and the pattern can be corresponsive to the hollow pattern 21 and the translucent pattern 71, and the translucent plate 7 is made of a fluorescent plastic material, so that translucent plate 7 shows the fluorescent light when the aforementioned light projected onto the translucent plate 7.

In a further preferred embodiment, the present invention further comprises a bottom cover 8 installed in the slot opening 111, and two symmetric arc lugs 81 disposed at the top of the bottom cover 8, and a positioning slot 82 formed between the lugs 81 for containing the vibrator 4, and the vibrator 4 is embedded into the positioning slot 82 and positioned at the center under the control unit 3. The vibrator 4 includes a plurality of power lines 41, and the bottom cover 8 includes a plurality of through openings 83, 84 for passing the conductive wires 32 and the power lines 41 through the slot opening 111 to the outside of the containing slot 11. Therefore, the bottom cover 8 can be used to seal the slot opening 111 to prevent external dust or moisture from entering into the containing slot 11, and the bottom cover 8 of the slot opening 111 can be removed freely to facilitate the maintenance and repair of the sensing plate 2, the control unit 3, the conductive element 31 and the vibrator 4 in the containing slot 11.

What is claimed is:

1. A switch-on/off vibrating alert device, comprising:
   a switch casing;
   a touch device, installed flatly onto the casing, and provided for a human hand to touch in order to turn on/off the switch, the touch device being in a transparent and translucent type;
   a vibrator, installed in the casing, for producing a vibration when receiving a control for an operation of turning on/off the switch from the touch device, and driving the casing and the touch device to vibrate synchronously;
   a containing slot, formed inside the casing, and the vibrator being installed in the containing slot;
   a metal sensing plate, installed in the containing slot at a position proximate to the touch device to an extent sufficient to sense the touch of a human hand, and the touch device outputting a sensing signal after sensing the touch of the human hand, the sensing plate having a hollow pattern disposed thereon;

a translucent plate, installed in the containing slot between the touch device and the sensing plate, the translucent plate being in a semi-transparent and translucent type;

a control unit, installed in the containing slot;

a conductive element electrically coupled between the sensing plate and the control unit for transmitting the sensing signal to the control unit, where the control unit outputs a trigger signal for turning on/off and controlling an external electric appliance, and the vibrator receiving the trigger signal for vibrating;

a first light emitting diode, installed at the top of the control unit; and a reflective cup, partitioned between the sensing plate and the control unit, and having a downwardly tapered reflective conical groove, the reflective cup being installed in the containing slot at an outer periphery of the first light emitting diode, such that the first light emitting diode is disposed in the conical groove, and the first light emitting diode receives the trigger signal to emit light, where the light emitted by the first light emitting diode is reflected and condensed by the conical groove to pass through the hollow pattern and the touch device and projected towards the top of the casing.

2. The switch-on/off vibrating alert device of claim 1, wherein the switch is a touch switch, a press-button switch, a toggle switch or a knob switch.

3. The switch-on/off vibrating alert device of claim 1, wherein the conductive element is substantially in a spiral shape.

4. The switch-on/off vibrating alert device of claim 1, wherein the translucent plate has a notch formed at the bottom of the translucent plate for containing the sensing plate, and a translucent pattern corresponding to the hollow pattern.

5. The switch-on/off vibrating alert device of claim 1, further comprising:
the casing having an outer peripheral wall substantially in a translucent type;
a plurality of second light emitting diodes, installed at the periphery of the control unit; and
a reflective cup, partitioned between the sensing plate and the control unit, and having a reflective conical surface formed at an outer wall of the reflective cup, and the reflective cup being installed in the containing slot between the second light emitting diodes, and the second light emitting diodes being disposed at the outer periphery of the conical surface, and the second light emitting diode receiving the trigger signal to emit light, and the light emitted by the second light emitting diode being reflected by the conical surface, passed through the outer peripheral wall, and projected towards the surrounding of the casing.

6. A switch-on/off vibrating alert device, comprising:
a switch casing;
a touch device, installed flatly onto the casing, and provided for a human hand to touch in order to turn on/off the switch;
a vibrator, installed in the casing, for producing a vibration when receiving a control for an operation of turning on/off the switch from the touch device, and driving the casing and the touch device to vibrate synchronously;
a containing slot, formed inside the casing, and the vibrator being installed in the containing slot;
a metal sensing plate, installed in the containing slot at a position proximate to the touch device to an extent sufficient to sense the touch of a human hand, and the touch device outputting a sensing signal after sensing the touch of the human hand;
a control unit, installed in the containing slot; and
a conductive element electrically coupled between the sensing plate and the control unit for transmitting the sensing signal to the control unit, where the control unit outputs a trigger signal for turning on/off and controlling an external electric appliance, and the vibrator receives the trigger signal to produce a vibration;
wherein the casing includes a plurality of protruding rings disposed on an outer peripheral wall of the casing to provide an interference effect, and the periphery of the touch device is extended to the outside of the outer peripheral wall to form a circular flange.

7. A switch-on/off vibrating alert device, comprising:
a switch casing;
a touch device, installed flatly onto the casing, and provided for a human hand to touch in order to turn on/off the switch;
a vibrator, installed in the casing, for producing a vibration when receiving a control for an operation of turning on/off the switch from the touch device, and driving the casing and the touch device to vibrate synchronously;
a containing slot, formed inside the casing, and the vibrator being installed in the containing slot;
a metal sensing plate, installed in the containing slot at a position proximate to the touch device to an extent sufficient to sense the touch of a human hand, and the touch device outputting a sensing signal after sensing the touch of the human hand;
a control unit, installed in the containing slot; and
a conductive element electrically coupled between the sensing plate and the control unit for transmitting the sensing signal to the control unit, where the control unit outputs a trigger signal for turning on/off and controlling an external electric appliance, and the vibrator receives the trigger signal to produce a vibration;
wherein the casing includes a slot opening formed at the bottom of the casing and interconnected to the containing slot, a bottom cover installed in the slot opening, and a positioning slot formed at the top of the bottom cover for containing the vibrator.

* * * * *